(12) United States Patent
Modha et al.

(10) Patent No.: US 7,978,510 B2
(45) Date of Patent: Jul. 12, 2011

(54) STOCHASTIC SYNAPSE MEMORY ELEMENT WITH SPIKE-TIMING DEPENDENT PLASTICITY (STDP)

(75) Inventors: Dharmendra S. Modha, San Jose, CA (US); Stuart S. P. Parkin, San Jose, CA (US)

(73) Assignee: International Businesss Machines Corporation, Armonk, NY (US)

( * ) Notice: Subject to any disclaimer, the term of this patent is extended or adjusted under 35 U.S.C. 154(b) by 155 days.

(21) Appl. No.: 12/395,695

(22) Filed: Mar. 1, 2009

(65) Prior Publication Data

US 2010/0220523 A1 Sep. 2, 2010

(51) Int. Cl.
*G11C 11/34* (2006.01)
(52) U.S. Cl. .................. 365/177; 365/189.12; 365/194; 365/226
(58) Field of Classification Search .................. 365/167, 365/177, 218, 189.011, 69, 189.12, 194, 365/226
See application file for complete search history.

(56) References Cited

U.S. PATENT DOCUMENTS

| | | | |
|---|---|---|---|
| 4,204,276 A * | 5/1980 | Glock et al. | 365/155 |
| 4,874,963 A | 10/1989 | Alspector | |
| 5,117,391 A * | 5/1992 | Hwang et al. | 365/155 |
| 5,248,899 A | 9/1993 | Haronian et al. | |
| 5,299,286 A | 3/1994 | Imondi et al. | |
| 7,151,029 B2 * | 12/2006 | Bozano et al. | 438/257 |
| 7,251,152 B2 * | 7/2007 | Roehr | 365/100 |
| 7,392,230 B2 | 6/2008 | Nugent | |
| 2005/0015351 A1 | 1/2005 | Nugent | |

FOREIGN PATENT DOCUMENTS

JP 2183237 7/1990

OTHER PUBLICATIONS

Abbott, L.F. et al., "Synaptic Computation," Nature, Oct. 14, 2004, pp. 796-803, vol. 431.
Abbott, L.F. et al., "Synaptic Depression and Cortical Gain Control," Science, Jan. 10, 1997, pp. 220-224, vol. 275.
Ananthanarayanan, R. et al., "Anatomy of a Cortical Simulator," presented at Supercomputing 2007, Nov. 2007, 12 pages.
Bozano, L.D. et al., "Mechanism for Bistability in Organic Memory Elements," Applied Physics Letters, Jan. 26, 2004, pp. 607-609, vol. 84, No. 4.
Bozano, L.D. et al., "Organic Materials and Thin-Film Structures for Cross-Point Memory Cells Based on Trapping in Metallic Nanoparticles," Advanced Functional Materials, Nov. 2005, pp. 1933-1939, vol. 15.
Chicca, E. et al, "A VLSI Recurrent Network of Integrate-and-Fire Neurons Connected by Plastic Synapses With Long-Term Memory," IEEE Transactions on Neural Networks, Sep. 2003, pp. 1297-1307, vol. 14, No. 5.

(Continued)

*Primary Examiner* — Pho M Luu
(74) *Attorney, Agent, or Firm* — Kenneth L. Sherman, Esq.; Michael Zarrabian, Esq.; Myers Andras Sherman & Zarrabian Esq.

(57) ABSTRACT

An active memory element is provided. A bipolar memory two-terminal element includes polarity-dependent switching. A probability of switching of the bi-polar memory element between a first state and a second state decays exponentially based on time delay and a difference between received signals at the two terminals and a switching threshold magnitude.

18 Claims, 7 Drawing Sheets

OTHER PUBLICATIONS

Gotshall, S. et al., "Stochastic Training of a Biologically Plausible Spino-neuromuscular System Model," Proceedings of the 9th annual conference on genetic and evolutionary computation, Jul. 2007, pp. 253-260.

Saldana-Pumarica, J. et al., "CMOS Encoder for Scale-Independent Pattern Recognition," Proceedings of the 20th annual conference on Integrated circuits and systems design, Sep. 2007, pp. 241-244.

Scott, J.C. et al., "Nonvolatile Memory Elements Based on Organic Materials," Advanced Materials, May 2007, pp. 1452-1463, vol. 19.

Song, S. et al., "Competitive Hebbian Learning Through Spike-Timing-Dependent Synaptic Plasticity," Nature Neuroscience, Sep. 2000, pp. 919-926, vol. 3, No. 9.

Valentino Braitenberg, Almut Schuz; "Cortex: Statistics and Geometry of Neuronal Connectivity"; Springer, 1998, pp. 1-240.

Goronkin, H. et al., "High-Performance Emerging Solid-State Memory Technologies", The Materials Research Society (MRS) Bulletin, Nov. 2004, pp. 805-813, vol. 29, No. 11, www.mrs.org/publications/bulletin.

Fazio A., "Flash Memory Scaling", The Materials Research Society (MRS) Bulletin, Nov. 2004, pp. 814-817, vol. 29, No. 11, www.mrs.org/publications/bulletin.

Grynkewich, G. et al., "Nonvolatile Magnetoresistive Random-Access Memory Based on Magnetic Tunnel Junctions", The Materials Research Society (MRS) Bulletin, Nov. 2004, pp. 818-821, vol. 29, No. 11, www.mrs.org/publications/bulletin.

Arimoto, Y., et al., "Current Status of Ferroelectric Random-Access Memory",The Materials Research Society (MRS) Bulletin, Nov. 2004, pp. 823-828, vol. 29, No. 11, www.mrs.org/publications/bulletin.

Hudgens, S., et al., "Overview of Phase-Change Chalcogenide Nonvolatile Memory Technology", The Materials Research Society (MRS) Bulletin, Nov. 2004, pp. 829-832, vol. 29, No. 11, www.mrs.org/publications/bulletin.

Yang, Y., et al, "Organic Thin-Film Memory", The Materials Research Society (MRS) Bulletin, Nov. 2004, pp. 833-837, vol. 29, No. 11, www.mrs.org/publications/bulletin.

Kuhr, W.G. et al., "Molecular Memories Based on a CMOS Platform," The Materials Research Society (MRS) Bulletin, Nov. 2004, pp. 838-842, vol. 29, No. 11, www.mrs.org/publications/bulletin.

Silva, H., et al., "Nonvolatile Silicon Memory at the Nanoscale", The Materials Research Society (MRS) Bulletin, Nov. 2004, pp. 845-851, vol. 29, No. 11, www.mrs.org/publications/bulletin.

* cited by examiner

STOCHASTIC SYNAPSE MEMORY ELEMENT WITH SPIKE-TIMING DEPENDENT PLASTICITY (STDP)

GOVERNMENT RIGHTS

This invention was made with United States Government support under Agreement No. HR0011-09-C-0002 awarded by Defense Advanced Research Projects Agency (DARPA). The government has certain rights in the invention.

BACKGROUND

1. Field of the Invention

The present invention relates generally to memory devices, and more specifically, to bi-polar memory switching elements.

2. Description of the Related Art

Modern electronics has evolved through a series of major hardware developments such as transistors, integrated circuits, memories, and microprocessors. This has led to ubiquitous programmable electronic machines. Owing both to limitations in hardware and architecture, such electronic machines are of limited utility in complex, real-world environments, which demand an intelligence that has not yet been captured in an algorithmic-computational paradigm. As compared to biological systems, for example, such programmable electronic machines are less efficient by a factor of one million to one billion in complex, real-world environments.

BRIEF SUMMARY

An active memory element is provided. One embodiment of the invention includes a bi-polar two-terminal memory element having polarity-dependent switching. A probability of switching of the bi-polar memory element between a first state and a second state decays exponentially based on time delay between received signals at the two terminals and a difference between received signal magnitude and a switching threshold magnitude.

Another embodiment of the invention provides an active memory system. One implementation includes a crossbar array including interconnected bi-polar memory elements each having polarity-dependent switching. A signal controller device is configured to apply signal pulses to the bi-polar memory elements. The probability of switching of each bi-polar memory element between a first state and a second state decays exponentially based on time delay between received signals and a difference between received signal magnitude and a switching threshold magnitude.

Still another embodiment of the invention comprises a method for providing active memory. In one embodiment of the invention, a bi-polar memory element having polarity-dependent switching is provided. Data is stored by applying a first signal to the bi-polar memory element, wherein a probability of switching from a low conductance OFF state to a high conductance ON state to store data on the bi-polar memory element decays exponentially based on a time delay between a pre-synaptic pulse and a post-synaptic pulse across a switching threshold magnitude of the bi-polar memory element. The data is erased by receiving a second signal to the bi-polar memory element, wherein a probability of switching from the high conductance ON state to the low conductance OFF state to erase the data decays exponentially based on a delay between a post-synaptic pulse and a pre-synaptic pulse across the switching threshold magnitude of the bi-polar memory element.

Other aspects and advantages of the present invention will become apparent from the following detailed description, which, when taken in conjunction with the drawings, illustrate, by way of example, the principles of the invention.

BRIEF DESCRIPTION OF THE SEVERAL VIEWS OF THE DRAWINGS

For a fuller understanding of the nature and advantages of the invention, as well as a preferred mode of use, reference should be made to the following detailed description read in conjunction with the accompanying drawings, in which.

DETAILED DESCRIPTION

The following description is made for the purpose of illustrating the general principles of the invention and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification, as well as meanings understood by those skilled in the art and/or as defined in dictionaries, treatises, etc. The description may disclose several preferred embodiments for bi-polar memory-switching elements, including nano-scale memory array resources, as well as operation and/or component parts thereof. While the following description will be described in terms of memory synaptronic devices for clarity and placing the invention in context, it should be kept in mind that the teachings herein may have broad application to all types of systems, devices and applications. It should be noted that in creating new computers that mimic biological design of the brain, a key component is the synapse, which is the junction between neurons. A synapse can be thought of as an active memory element.

An active memory may include a bi-polar memory element having polarity-dependent switching. In a preferred embodiment of the invention a probability of switching of the bi-polar memory element between a first state and a second state decays exponentially based on a difference between a switching threshold signal and an applied signal.

Figure 1A:
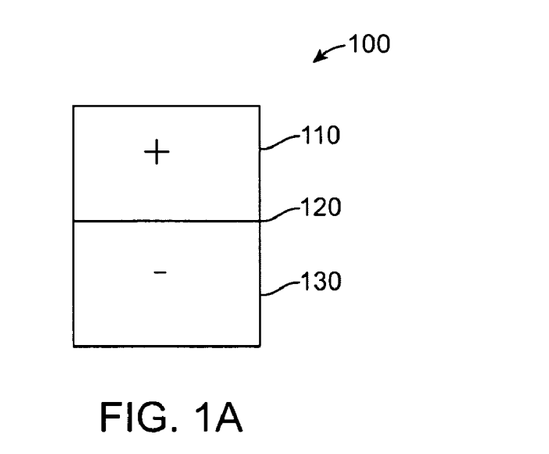
FIG. 1A illustrates a bi-polar memory-switching element according to one embodiment of the invention.

FIG. 1A illustrates a bi-polar memory-switching element 100 as shown according to one embodiment of the invention. The bi-polar memory-switching element 100 includes a first terminal nano-element 110 and a second terminal nano-element 130. This embodiment may comprise resistive random access memory (RRAM) (e.g., metal-oxide elements, such as Cu-oxide, Ni-oxide, etc., organic nanotraps, phase-change material, electrolyte material or magnetic tunnel junction (MTJ) material, such that to perform a program or store function on data (i.e., switch from low conductance ("OFF") to high conductance ("ON")) and to perform an erase or delete function on data (i.e., switch from high conductance ("ON") to low conductance ("OFF")), signal pulses (e.g., voltage, current, etc.) of opposite polarity are used.

In one embodiment of the invention, a switching threshold magnitude (e.g., a voltage threshold, $V_{TH}$) exists based on the material used that is sufficient to perform a program operation, and a reverse polarity threshold (e.g., $-V_{TH}$) exists that is sufficient to perform an erase operation. In one embodiment of the invention, the switching threshold magnitude is based on the material selected for the bi-polar memory-switching element 100. In other embodiments selection of material may be based on other characteristics, such as implementation, deployment, timing, magnitude requirements, etc.

In one embodiment of the invention, the bi-polar memory-switching element 100 has the characteristic that, when an applied signal has a magnitude that is less than the switching threshold magnitude (e.g., voltage V applied has a magnitude less than $V_{TH}$), there is a probability of switching depending upon the difference between the applied signal magnitude and the switching threshold magnitude (e.g., $V_{TH}-V$). In this embodiment of the invention, for example, using MTJs, there exists a probabilistic switching behavior with exponentially decaying dependence on the difference between the applied signal and the switching threshold (e.g., $V_{TH}-V$). For this embodiment of the invention, Spike-Timing Dependent Plasticity (STDP)-like synaptic behavior exists. STDP is a general term for functional changes in biological neurons and at biological synapses that are sensitive to the timing of action potentials in connected neurons. STDP can result from pre-synaptic spikes preceding post-synaptic spikes and post-synaptic spikes preceding pre-synaptic spikes. Pre-post spiking causes long-term potentiation (LTP) of the synapse, and post-pre spiking causes long-term depression (LTD). In this embodiment of the invention, the bi-polar memory-switching element 100 behaves similarly as a bio-logical synapse, but comprises non-biological material.

In certain embodiments of the invention, the bi-polar memory-switching element 100 may include materials and material systems that have multiple resistance states, depending on the application of, for example, electric fields, voltages or thermal excursions. In many of said materials and material systems, a resistance change is caused by the motion of atoms or molecules or, by contrast, defects (e.g., oxygen vacancies in oxides). Resistance changes typically take place in inhomogeneous systems so that the resistance changes scale poorly as the dimensions of the inhomogeneous systems are decreased, giving rise to larger statistical fluctuations in inhomogeneous system response. These structural changes may lead to irreversible changes in the materials so that, over time, they can become less responsive.

In other embodiments of the invention the bi-polar memory-switching element 100 may involve the use of devices whose properties can be controlled without the motion of atoms or any other changes in the fundamental underlying atomic structure of the device. These embodiments of the invention may include the use of charge accumulation or transfer, such as spintronic materials and phenomena. As shown by example in FIG. 1A, an MTJ device may be used which may comprise at least two thin ferromagnetic layers (110, 130) separated by an ultra-thin dielectric insulating spacer layer (120). The tunneling conductance of an MTJ device depends on the relative orientation of the magnetization directions of the two ferromagnetic (F) layers.

In certain embodiments of the invention when the dielectric insulating spacer layer 120 comprises a (1-0-0) oriented crystalline layer of MgO, the change in conductance exceeds several hundred percent at room temperature when the orientation of the F electrodes is changed from parallel (P) to antiparallel (AP). The conductance of an MTJ may be varied by the passage of sufficiently high current pulses via the phenomenon of spin-transfer torque. The current tunneling from one F electrode is spin-polarized and carries spin-angular momentum. When transferred to the magnetization of the second F electrode, the spin angular momentum gives rise to a torque which can result in the rotation of the magnetic moment direction of the F moment.

One embodiment of the invention may use deep sub-micron sized MTJ material whose quiescent state favors the AP arrangement of the F electrodes (via dipolar coupling at the edges of the device). By spin-engineering these devices, one embodiment of the invention may use MTJ material in which successive voltage pulses cause the relative orientation of the F moments to align, effectively increasing the conductance. Since, for successive voltage pulses the conductance of the device will be slightly increased, the current flowing will also be increased and the corresponding angular change larger. By spin-engineering the device, thermal relaxation will allow for the gradual return of the F electrodes to their favored AP state. In one embodiment of the invention, the time scale for this relaxation may be adjusted (by engineering the magnetic anisotropy of the F electrodes) to be anywhere from nanoseconds to milliseconds or even hours or days. In this embodiment of the invention, the MTJ material may exhibit the basic characteristics of a biological synapse in a non-biological device for the bi-polar memory-switching element 100. On a larger scale, a neuron is a biological tissue that includes any of the impulse-conducting cells that constitute the brain, spinal column, and nerves, consisting of a nucleated cell body with one or more dendrites and a single axon. It is known that a neuron has roughly $10^4$ synapses. Therefore, in one embodiment of the invention, more complex electronic memory structures are grouped together to behave like neurons and a plurality of neurons.

Figure 1B:
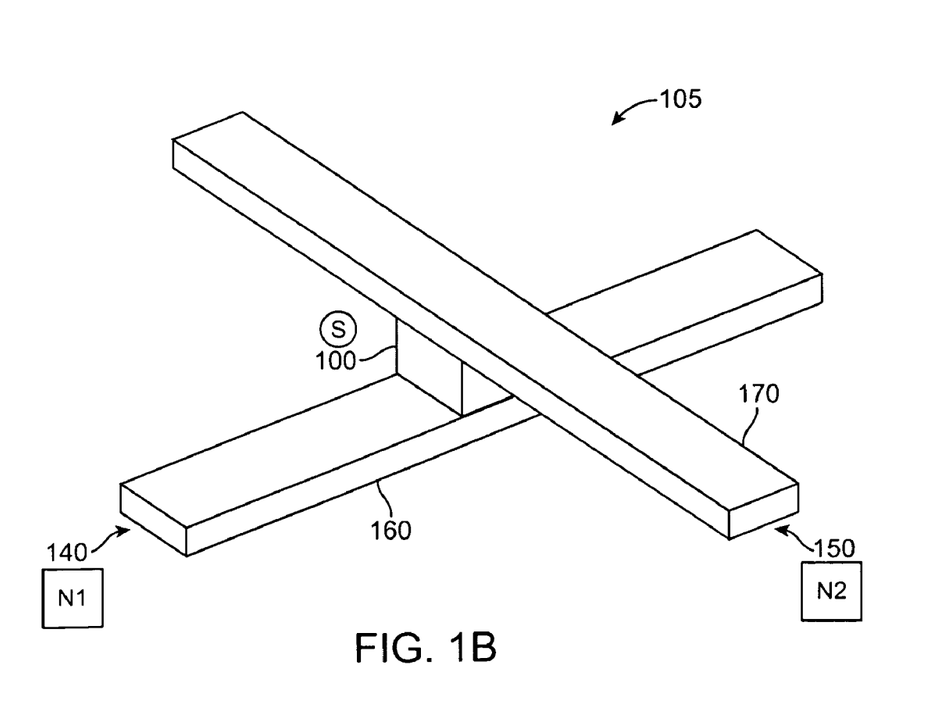
FIG. 1B illustrates a synapse (S) connected between a pre-synaptic neuron (N1) and a post-synaptic neuron (N2) according to one embodiment of the invention.

FIG. 1B illustrates an embodiment of the invention of a synapse device 105 including a bi-polar switching element 100 (e.g., an MJT device) connected between a pre-synaptic conductor "bar" 160 that connects to the first terminal nano-element 110 and a post-synaptic conductor "bar" 170 that connects to a second terminal nano-element 130. In one embodiment of the invention the bi-polar memory-switching element 100 behaves as a non-biological synapse In one embodiment of the invention a pre-synaptic pulse is directed from a pre-synaptic neuron N1 140 through the pre-synaptic conductor 160 in the direction of the arrow pointing from the pre-synaptic neuron N1 140. A post-synaptic pulse is directed from a post-synaptic neuron N2 150 through the post-synaptic conductor 170 in the direction of the arrow pointing from the post-synaptic neuron N2 150. When the pre-synaptic neuron N1 140 "fires" it emits a pre-synaptic voltage pulse across the synapse S 100. When the post-synaptic neuron N2 150 "fires" it emits a post-synaptic voltage pulse across the synapse S 100. A delay results based on the difference in timing between pre-synaptic voltage pulses and post-synaptic voltage pulses. In one embodiment of the invention, the timing range when a pre-synaptic pulse occurs through the pre-synaptic conductor 160 and before the bi-polar memory-switching element 100 switches to the ON state is between 80-100 ms. In one embodiment of the invention, when the pre-synaptic and the post-synaptic pulses are delayed or rearranged, they effect memory states of the bi-polar memory-switching element 100.

The following material parameters depend upon the material composition and dopant used by the embodiments of the invention: (a) Crystallization speed; (b) Melting temperature; (c) Resistances in both ON/OFF phases; (d) Crystallization temperature; (e) Chemical stability; and (f) Thermal conductivity.

Figure 2A:
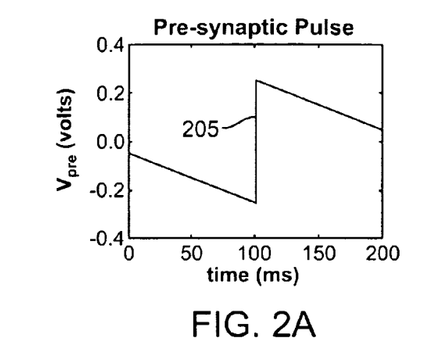
FIG. 2A illustrates an example graph of a pre-synaptic pulse according to one embodiment of the invention.
Figure 2B:
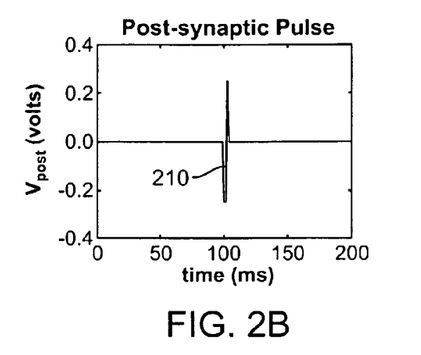
FIG. 2B illustrates an example graph of a post-synaptic pulse according to one embodiment of the invention.

FIG. 2A illustrates an example of a pre-synaptic pulse 205, such as a pre-synaptic voltage pulse ($V_{pre}$), and FIG. 2B illustrates an example of a post-synaptic pulse 210, such as post-synaptic voltage pulse ($V_{post}$). While each example pulse applied is a voltage pulse, other pulses may be used, such as current pulses, etc. In this example, the voltage applied to the bi-polar memory-switching element 100 is $V=(V_{pre}-V_{post})$.

Figure 3A:
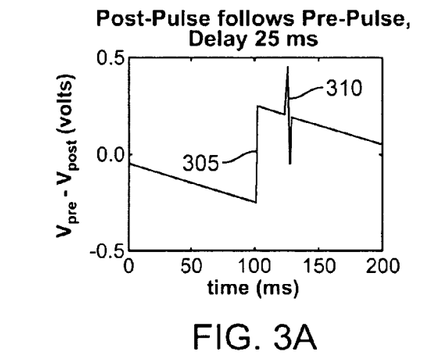
FIG. 3A illustrates an example graph of a post-synaptic pulse following a pre-synaptic pulse with a first delay duration according to one embodiment of the invention.
Figure 3B:
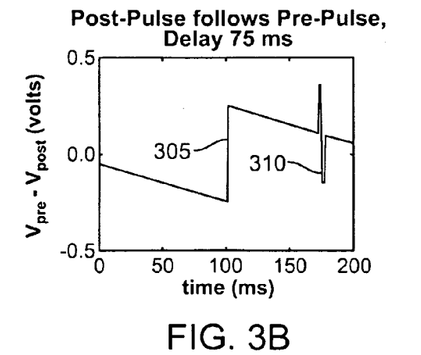
FIG. 3B illustrates an example graph of a post-synaptic pulse following a pre-synaptic pulse at a second delay duration according to one embodiment of the invention.

FIGS. 3A and B show the case where the post-synaptic pulse 310 follows the pre-synaptic pulse 305. In the example illustrated in FIG. 3A, a delay of 25 ms. is used for the post-synaptic pulse. In both of these cases, a high positive voltage develops across the bi-polar memory-switching element 100 for a small duration of time in the range of a few nanoseconds. In this embodiment of the invention, the largest positive voltage developed across the element depends upon the relative delay between the two pulses. The pre-synaptic pulse is emitted when the neuron connected to the pre-synaptic terminal of the element, and the post-synaptic pulse is emitted when the neuron connected to the post-synaptic terminal of the element. In one embodiment of the invention, the smaller the delay between firing of the pre-synaptic and post-synaptic neurons, the higher the maximum value of V, and, hence, the higher the probability that the bi-polar memory-switching element 100 will switch to the ON state from the OFF state.

Figure 4A:
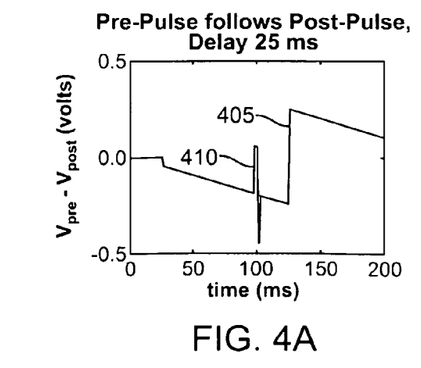
FIG. 4A illustrates an example graph of a pre-synaptic pulse following a post-synaptic pulse with a first delay duration according to one embodiment of the invention.
Figure 4B:
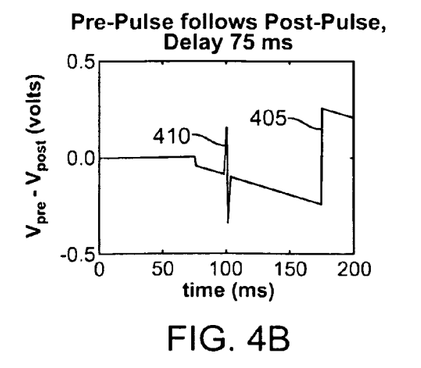
FIG. 4B illustrates an example graph of a pre-synaptic pulse following a post-synaptic pulse with a second delay duration according to one embodiment of the invention.

Similarly, FIGS. 4A and B show the case where the pre-synaptic pulse 405 follows the post-synaptic pulse 410. In both of these cases, a high negative voltage develops across the bi-polar memory-switching element 100 for a small duration of time in the range of a few nanoseconds according to an embodiment of the invention. In this embodiment of the invention, the smallest negative voltage developed depends upon the controlled delay between the two pulses. As FIGS. 4A and B illustrate, the smaller the delay between firing of the post- and pre-neurons, the smaller the minimum value of V, and, hence, the higher the probability that the device will switch to the OFF state from the ON state.

In one embodiment of the invention the conductance of the bi-polar memory-switching element 100 will always be binary, that is ON or OFF. However, switching from one state to another is probabilistic depending upon the amount of delay between the two pulses according to an embodiment of the invention. Therefore, the embodiment of the invention has a stochastic synapse that has STDP-like behavior. As discussed earlier, a neuron has $10^4$ synapses, and, if all the plastic synapses are stochastic, then, by the law of large numbers, it is equivalent to having multiple conductance states within each synapse. Therefore, this embodiment of the invention may exploit physical material characteristics to engender STDP-like behavior.

In another embodiment of the invention, a bi-polar memory-switching element 100 switches polarity at $V_{TH}$ or $-V_{TH}$, but does not have probabilistic switching behavior. In this embodiment of the invention, by using a simpler pre-synaptic heaviside step pulse (without the slopes on either sides), a switching behavior will program the bi-polar memory-switching element 100 if the post-synaptic pulse follows the pre-synaptic pulse within 100 ms, or erase the device if the pre-synaptic pulse follows the post-synaptic pulse within 100 ms. It should be noted that the illustrated values of voltage magnitude shown in FIGS. 2A, 2B, 3A, 3B, 4A and 4B are examples and other values may be used by other embodiments of the invention depending on applications, such as pattern recognition, linear classification, stimulated motor response, etc.

Figure 5A:
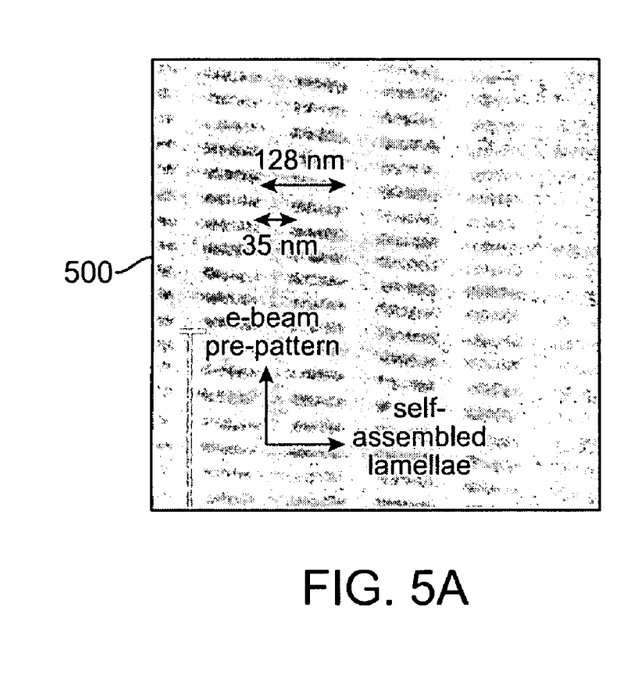
FIG. 5A illustrates a top view of an ultra-dense crossbar structure including bi-polar memory-switching elements.
Figure 5B:
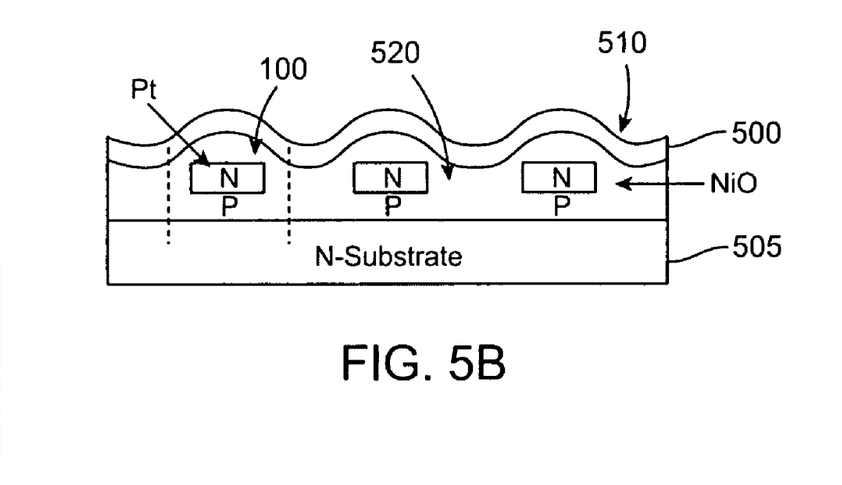
FIG. 5B illustrates an internal view of an ultra-dense crossbar structure including bi-polar memory-switching elements.
Figure 5C:
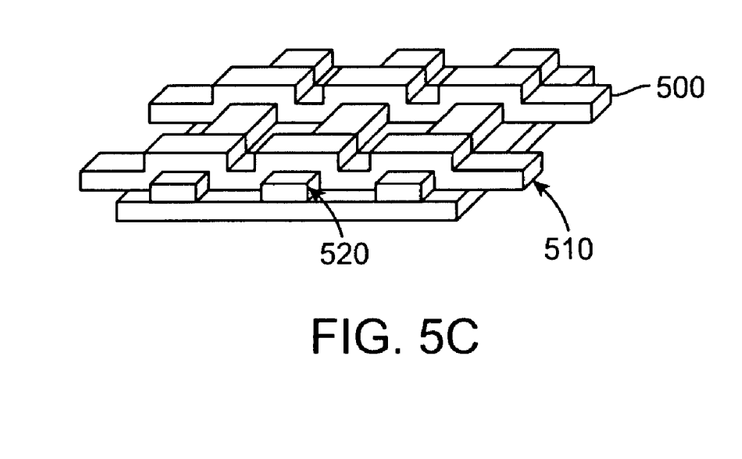
FIG. 5C illustrates a perspective view of an ultra-dense crossbar structure including bi-polar memory-switching elements.
Figure 5D:
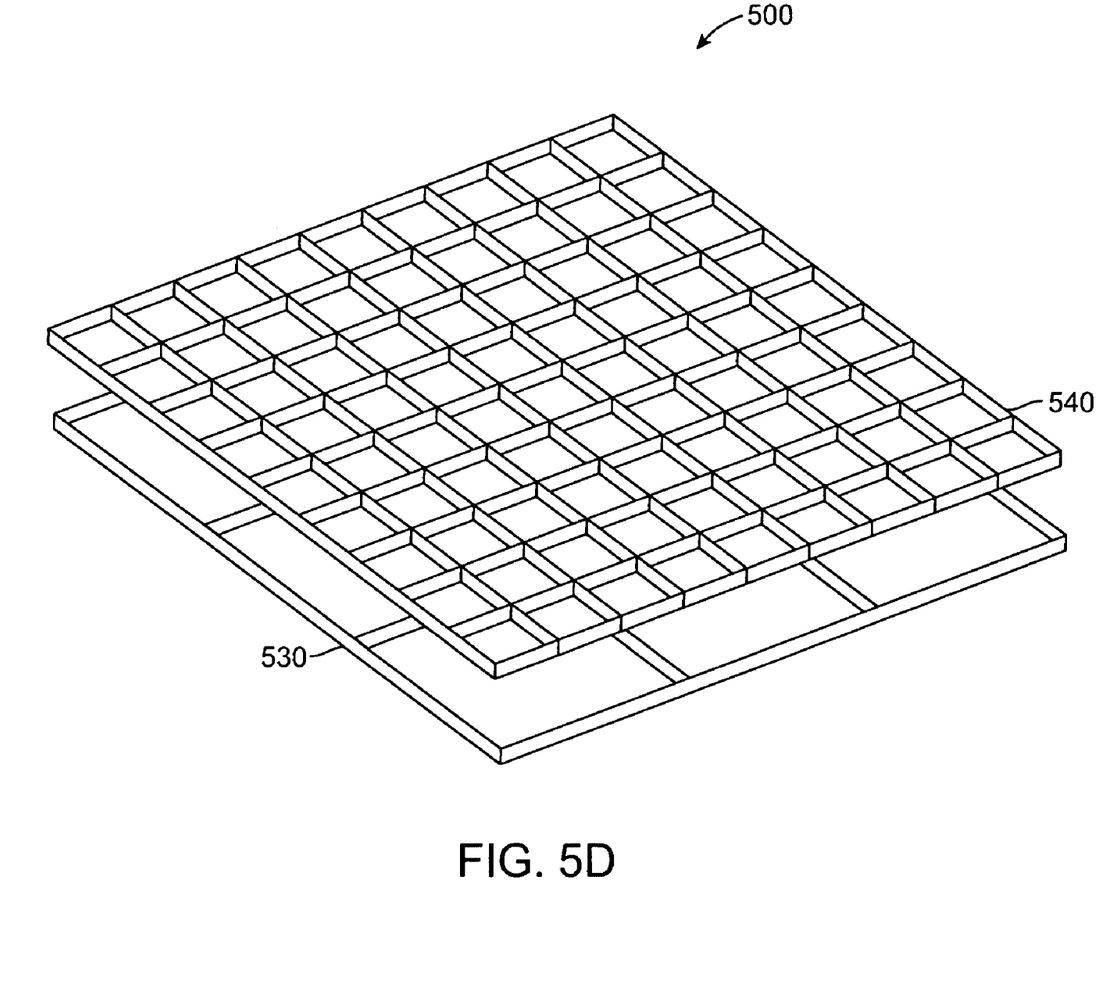
FIG. 5D illustrates a perspective view of an ultra-dense crossbar structure including a nanotechnology synapse crossbar over a neuron substrate.

FIG. 5A illustrates a top view of an ultra-dense crossbar structure 500 including a plurality of the bi-polar memory-switching elements 100 obtained by controlled self-assembly of block copolymer (horizontal lines) on top of vertical, pre-patterned e-beam lines. FIG. 5B illustrates a partial internal view of the ultra-dense crossbar structure 500 showing a substrate 505, including many bi-polar memory-switching elements 100, including top electrodes 510 and bottom electrodes 520. FIG. 5C illustrates a topological perspective view of the ultra-dense crossbar structure 500. FIG. 5D illustrates a layered perspective view of the ultra-dense crossbar structure 500 showing the upper nanotechnology synapse crossbar 540 that is a back-end-of-the-line (BEOL) portion of the ultra-dense crossbar structure 500, and the lower CMOS neuron sheet 530 that is the front-end-of-the-line (FEOL) portion of the ultra-dense crossbar structure 500 according to one embodiment of the invention. It should be noted that the BEOL portion of an integrated circuit fabrication line is where the active components (e.g., bi-polar memory-switching elements 100) are interconnected with wiring on the wafer and generally begins when the first layer of metal is deposited on a wafer. It includes contacts, insulator, metal levels, and bonding sites for chip-to-package connections. Dicing the wafer into individual integrated circuit chips is also a BEOL process. FEOL is generally the first portion of integrated circuit fabrication where individual devices are patterned in the semiconductor. FEOL generally covers everything up to (but not including) the deposition of metal layers.

In this embodiment of the invention, bi-polar memory-switching elements 100 acting as "synapses" and interconnections on top of CMOS circuits shown in FIG. 5B send and receive signals between the different synapses included in the complete structure. In this embodiment of the invention, the synapses are configured on a regular grid provided by self-assembly. Self-assembly is the spontaneous arrangement of individual elements into regular patterns; under suitable conditions, certain materials, such as block copolymers, self-organize into useful nanometer-scale patterns of interest for high performance microelectronics applications. Block copolymer films are similar to conventional polymer photoresist patterning materials used in semiconductor fabrication. However, unlike photoresists, block copolymers can autonomously form regular patterns at dimensions not achievable by lithographic means. Although polymer self-assembly can define only a limited set of pattern geometries, it provides a straightforward means for achieving feature sizes (<10 nm), pitches (<40 nm), and densities (~1011/cm2) that are currently not achievable by optical lithography. It is important to mention that, unlike the nanoimprint lithography, block copolymer patterning is manufacturing-ready; it is scalable to large diameter wafer batch processing (e.g., 300 mm wafer processing) and small feature size (9 nm). In one embodiment of the invention, uncontrolled self-assembly is used to obtain the ultra-dense crossbar structure 500.

Figure 6:
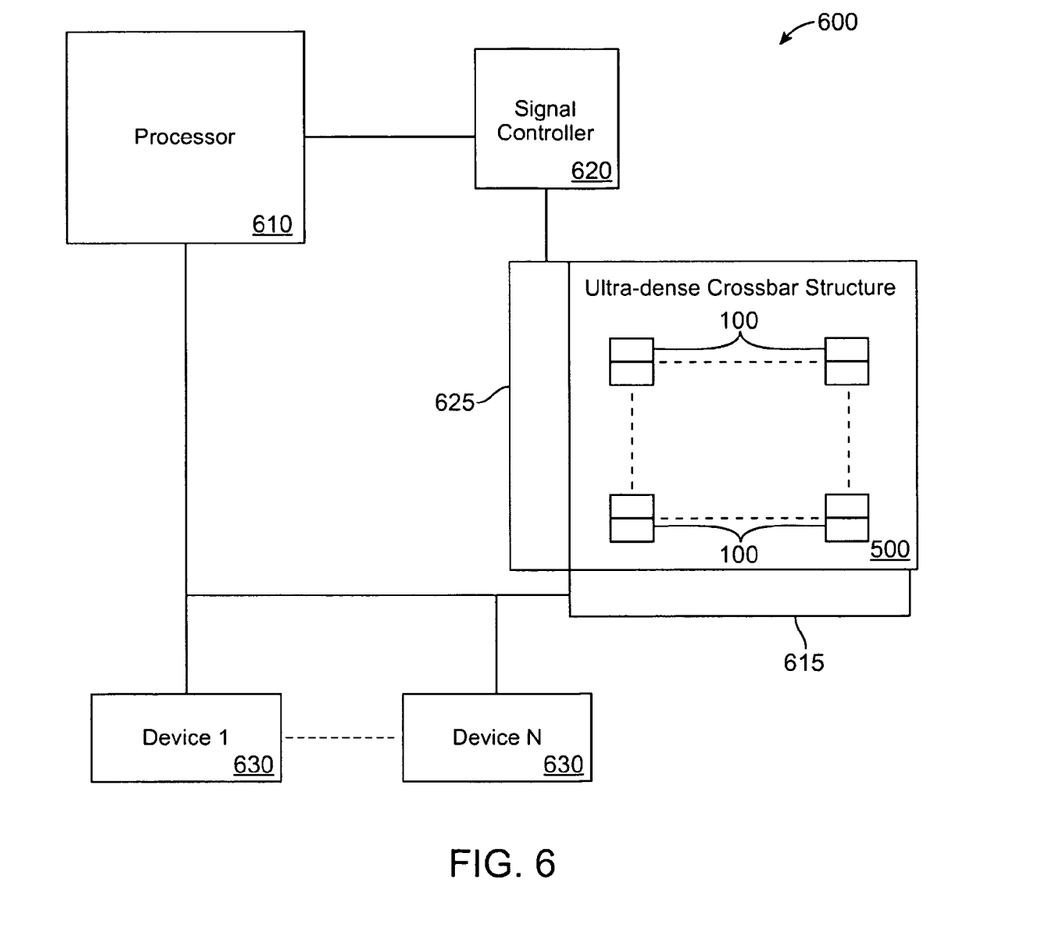
FIG. 6 illustrates a system including an ultra-dense cross bar structure including bi-polar memory-switching elements.

FIG. 6 illustrates a system 600 including an ultra-dense cross bar structure 500 including bi-polar memory-switching elements 100 according to one embodiment of the invention. Included in the system 600 is processor 610, a signal controller 620, a signal input interface 625, an output interface 615, and devices 1 through N 630. In one embodiment of the invention, signals, such as voltage pulses, current pulses, etc. are input by the signal controller 620 to the signal input interface 625, which distributes the signals to the ultra-dense crossbar structure 500. The input signals cause the bi-polar memory-switching elements 100 to either program or erase data. Devices 630, such as computing devices, sensing devices (e.g., optical, auditory, etc.), etc., may provide signals to the processor 610 and read out binary data stored in the ultra-dense crossbar structure 500 through the output interface 615.

Figure 7:
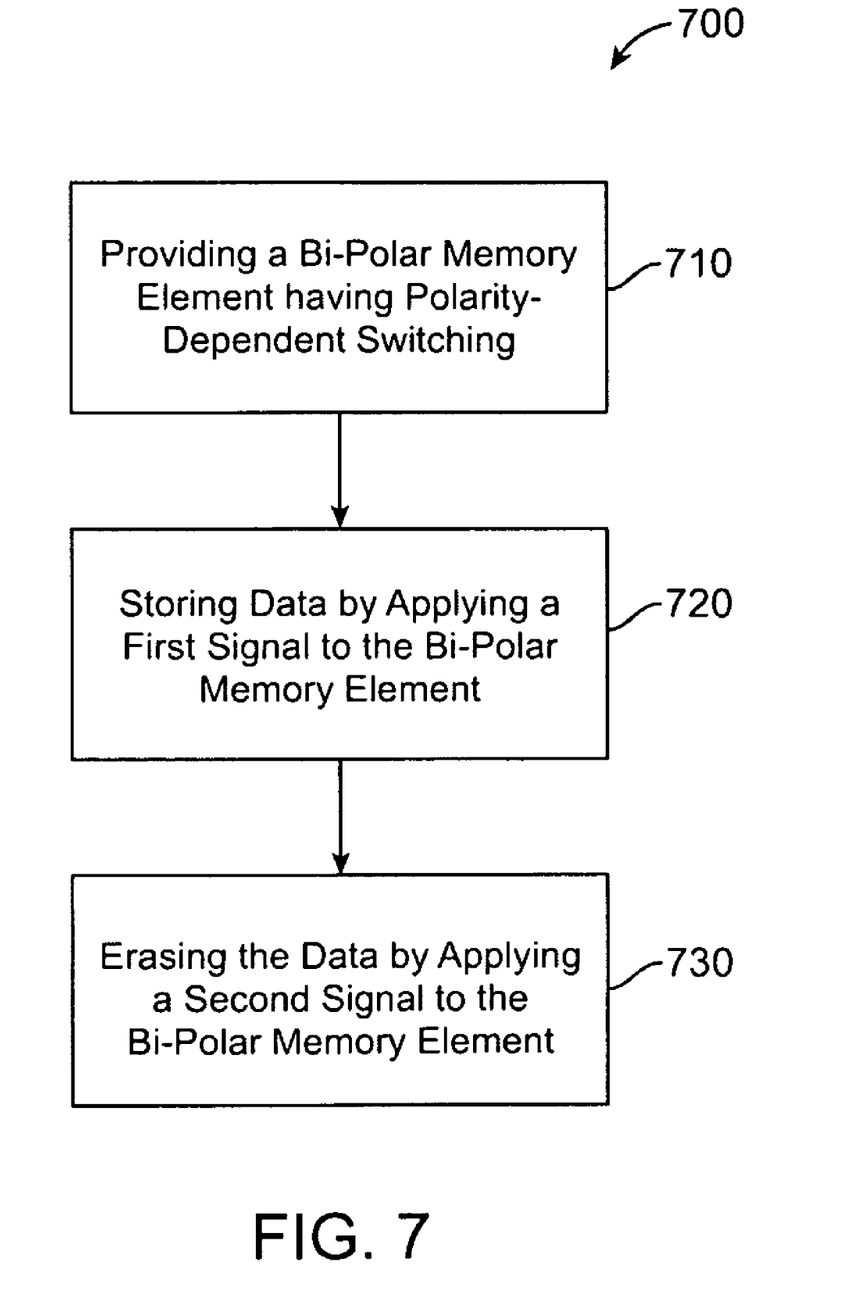
FIG. 7 illustrates a process for providing active memory.

FIG. 7 illustrates a process 700 for providing an active memory device. In block 710, a bi-polar memory element having polarity-dependent switching, such as the bi-polar memory-switching element 100, is provided according to one embodiment of the invention. In block 720, data is stored on the bi-polar memory element by applying a first signal to the bi-polar memory element, such as a pre-synaptic: voltage pulse, a current pulse, etc. In one embodiment of the invention, the probability of switching a bi-polar memory element from an OFF (low conductance) state to an ON (high conductance) state to store the data decays exponentially based on a delay duration between a pre-synaptic pulse and a post-synaptic pulse across a switching threshold of the bi-polar memory element. In block 730, data is erased by applying a second signal to the bi-polar memory element, such as a post-synaptic: voltage pulse, a current pulse, etc. In one embodiment of the invention the probability of switching from the ON state to the OFF state to erase the data decays exponentially based on delay duration between a post-synaptic pulse and a pre-synaptic pulse across the switching threshold of the bi-polar memory element.

Figure 8:
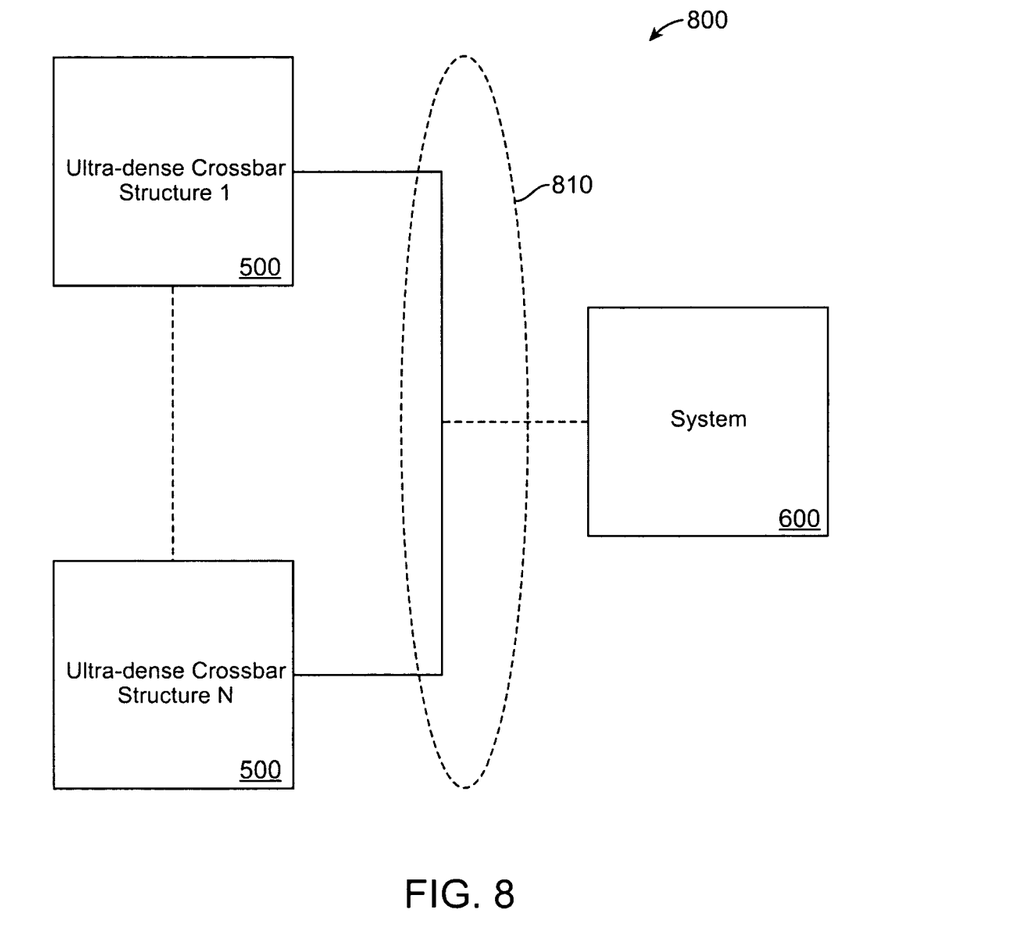
FIG. 8 illustrates a computing system including distributed systems of ultra-cross dense structures including bi-polar memory-switching elements.

FIG. 8 shows a block diagram of example architecture of an embodiment of a system 800 including distributed ultra-dense crossbar structure 1 500 through ultra-dense crossbar structure N 500 according to an embodiment of the invention. In this embodiment of the invention, the distributed ultra-dense crossbar structures 500 are connected to a central system '600 (i.e., system 600 without ultra-dense crossbar structure 500) through a network(s) 810, which can be wired, wireless, or any combination of wired and wireless networks.

As is known to those skilled in the art, the aforementioned example architectures described above, according to the present invention, can be implemented in many ways, such as program instructions for execution by a processor, as software modules, microcode, as computer program product on computer readable media, as logic circuits, as application specific integrated circuits, as firmware, etc. The embodiments of the invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc. Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart illustrated in FIG. 7 and block diagrams in FIGS. 1, 5A-C, 6 and 8 illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

I/O devices (including but not limited to keyboards, displays, pointing devices, etc.) can be connected to the system either directly or through intervening controllers. Network adapters may also be connected to the system to enable the data processing system to become connected to other data processing systems or remote printers or storage devices through intervening private or public networks. Modems, cable modem and Ethernet cards are just a few of the currently available types of network adapters. In the description above, numerous specific details are set forth. However, it is understood that embodiments of the invention may be practiced without these specific details. For example, well-known equivalent components and elements may be substituted in place of those described herein, and similarly, well-known equivalent techniques may be substituted in place of the particular techniques disclosed. In other instances, well-known structures and techniques have not been shown in detail to avoid obscuring the understanding of this description.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An active memory apparatus, comprising:
   a bi-polar two-terminal memory element having polarity-dependent switching, wherein a probability of switching of the bi-polar memory element between a first state and a second state decays exponentially based on time delay between received signals at the two terminals and a difference between received signal magnitude and a switching threshold magnitude, wherein the first state is a low conductance OFF state, and the second state is a high conductance ON state.

2. The apparatus of claim 1, wherein a probability of switching from the OFF state to the ON state decays exponentially based on a time delay between a received pre-synaptic voltage pulse from a first pulse source and a received post-synaptic voltage pulse from a second pulse source across the switching threshold magnitude of the bi-polar memory element.

3. The apparatus of claim 1, wherein a probability of switching from the ON state to the OFF state decays exponentially based on a time delay between a received post-synaptic voltage pulse from a second pulse source and a received pre-synaptic voltage pulse from a first voltage pulse source across the switching threshold magnitude of the bi-polar memory element.

4. The apparatus of claim 1, wherein a current state of the bi-polar two-terminal memory element remains constant when arrival times of the received signals do not overlap.

5. The apparatus of claim 1, wherein a switching between a high conductance to a low conductance resulting in an erase function of the bi-polar memory element, and a switching between the low conductance to the high conductance resulting in a store function of the bi-polar memory element, are made with voltage pulses of opposite polarity.

6. The apparatus of claim 1, wherein the received signals comprise a first voltage pulse and a second voltage pulse, and switching the state of the bi-polar two-terminal memory element is dependent on relative pulse characteristics of the first voltage pulse in relation to the pulse characteristics of the second voltage pulse.

7. The apparatus of claim 6, wherein the pulse characteristics include pulse magnitude, pulse shape, pulse duration, polarity and pulse timing.

8. The apparatus of claim 7, wherein the fist pulse is emitted having a first voltage magnitude and gradually changes to a second voltage magnitude over a first time interval, the first voltage pulse switches suddenly over a second time interval to a third voltage magnitude and gradually changes to a fourth voltage magnitude over a third time interval, and wherein the second voltage pulse is emitted at a baseline voltage magnitude for a fourth time interval, switches abruptly over a fifth time interval to a fifth voltage magnitude, switches abruptly over a sixth time interval to a sixth voltage magnitude, switches abruptly over a seventh time interval to the baseline voltage magnitude, and then remains at the baseline voltage magnitude over a eighth time interval.

9. The apparatus of claim 8, wherein the first voltage pulse and the second voltage pulse are reversible.

10. The apparatus of claim 9, wherein the first and the second voltages have the same polarity, the third and the fourth voltages have the same polarity but opposite polarity of the first and second voltages, and the fifth and the sixth voltages have opposite polarity of each other.

11. An active memory system, comprising:
a crossbar array including a plurality of interconnected bi-polar memory elements each having polarity-dependent switching;
a signal controller device configured to apply signal pulses to the plurality of bi-polar memory elements,
wherein a probability of switching of each bi-polar memory element between a first state and a second state decays exponentially based on time delay between received signals and a difference between received signal magnitude and a switching threshold magnitude, and the first state is a low conductance ON state, and the second state is a high conductance OFF state.

12. The active memory system of claim 11, wherein a probability of switching from the OFF state to the ON state decays exponentially based on a time delay between a received pre-synaptic voltage pulse from a first voltage pulse source and a received post-synaptic voltage pulse from a second voltage pulse source across the switching threshold magnitude of the bi-polar memory element.

13. The active memory system of claim 11, wherein a probability of switching from the ON state to the OFF state decays exponentially based on a time delay between a received post-synaptic voltage pulse from a second voltage pulse source and a received pre-synaptic voltage pulse from a first voltage pulse source across the switching threshold magnitude of the bi-polar memory element.

14. The active memory system of claim 11, wherein the crossbar array is patterned using one of self-assembly, and controlled self-assembly, of diblock copolymers.

15. The active memory system of claim 11, wherein for each bi-polar memory element, a switching between a high conductance to a low conductance resulting in an erase function of the bi-polar memory element, and a switching between the low conductance to the high conductance resulting in a store function of the bi-polar memory element, are made with voltage pulses of opposite polarity.

16. The active memory system of claim 11, wherein each bi-polar memory element includes a first polar portion including a first terminal nano-element and a second polar portion including a second terminal nano-element.

17. A method of providing active memory, comprising:
providing a bi-polar memory element having polarity-dependent switching;
storing data by applying a first signal to the bi-polar memory element, wherein a probability of switching from a low conductance OFF state to a high conductance ON state to store data on the bi-polar memory element decays exponentially based on a time delay between a received pre-synaptic pulse and a received post-synaptic pulse across a switching threshold magnitude of the bi-polar memory element; and
erasing the data by receiving a second signal to the bi-polar memory element, wherein a probability of switching from the high conductance ON state to the low conductance OFF state to erase the data decays exponentially based on a delay between a received post-synaptic pulse and a received pre-synaptic pulse across the switching threshold magnitude of the bi-polar memory element.

18. The method of claim 17, further comprising:
switching the bi-polar memory element between a low conductance to a high conductance with a voltage pulse having a first polarity; and
switching the bi-polar memory element between the high conductance to the low conductance with a voltage pulse of a second polarity,
wherein the first polarity and the second polarity are opposite one another.

* * * * *